United States Patent [19]
Hintermaier

[11] Patent Number: 6,037,002
[45] Date of Patent: Mar. 14, 2000

[54] PROCESS FOR PRODUCING THIN FILMS OF OXIDE CERAMIC

[75] Inventor: Frank Hintermaier, Munich, Germany

[73] Assignee: Siemens Aktiengesellschaft, Munich, Germany

[21] Appl. No.: 09/115,169

[22] Filed: Jul. 14, 1998

[30] Foreign Application Priority Data

Jul. 14, 1997 [DE] Germany .................. 197 30 119

[51] Int. Cl.$^7$ .................. C23C 16/40; B05D 3/06
[52] U.S. Cl. .................. 427/255.31; 427/255.32; 427/255.28; 427/126.3; 427/576; 427/595
[58] Field of Search .................. 427/255.3, 255.2, 427/255.1, 595, 576, 569, 255.31, 255.32, 255.28, 126.3; 505/477

[56] References Cited

U.S. PATENT DOCUMENTS

| | | |
|---|---|---|
| 5,164,363 | 11/1992 | Eguchi et al. . |
| 5,254,530 | 10/1993 | Sugimoto et al. . |
| 5,478,610 | 12/1995 | Desu et al. . |
| 5,637,351 | 6/1997 | O'Neal et al. . |
| 5,686,151 | 11/1997 | Imai et al. .............. 427/576 |

FOREIGN PATENT DOCUMENTS

| | | |
|---|---|---|
| 0 560 617 A2 | 9/1993 | European Pat. Off. . |
| 0 742 290 A1 | 11/1996 | European Pat. Off. . |
| 63-259070 | 10/1988 | Japan . |

OTHER PUBLICATIONS

International Application WO 93/13243 (Buchanan et al.), dated Jul. 8, 1993.
Japanese Patent Abstract No. 06166597 (Takuo), dated Jun. 14, 1994.
Japanese Patent No 7–273216, dated Oct. 20, 1995.
Takuma Katayama et al.: "Photo–MOCVD of PbTiO3 thin films", Journal of Crystal Growth, 115(1991) Dec. pp. 289–293.
Weyten et al, Physica C 270, pp. 207–215, 1996.
International Publication No. WO 96/08587 (Kirlin et al.), dated Mar. 21, 1996.

*Primary Examiner*—Roy V. King
*Attorney, Agent, or Firm*—Herbert L. Lerner; Laurence A. Greenberg; Werner H. Stemer

[57] ABSTRACT

A process for producing thin films of oxide ceramic by deposition of metal oxides on a surface. An accelerator is added to initiate oxidation of organometallic precursors.

3 Claims, 2 Drawing Sheets

Kinetically controlled    Diffusion controlled

Upper Pt electrode
Dielectric
Lower Pt electrode

← Plug

PROCESS FOR PRODUCING THIN FILMS OF OXIDE CERAMIC

BACKGROUND OF THE INVENTION

Field of the Invention

The invention relates to a process for producing thin films of oxide ceramic.

CVD (chemical vapor deposition) processes are increasingly used to deposit thin films of oxide ceramic. In those processes, the starting materials which are used are organometallic precursors which decompose in a temperature range from 300 to 800° C. on a hot substrate or wafer surface and are thus converted into the corresponding oxides. An oxidizing gas, e.g. $O_2$, which burns the organic component of the precursors, is used for the oxidation of the organometallic precursors. Such oxidation processes usually proceed with the involvement of free radicals. Free-radical chain reactions frequently occur. Up to now, only oxidizing gases, e.g. $O_2$ or its mixtures, e.g. $O_2/N_2O$, have been used. In the preparation of BST ((Ba, Sr)$TiO_3$), for example, the precursors Sr(thd)$_2$(tetraglyme), Ba(thd)$_2$(tetraglyme) and (Ti(OiPr)$_2$(thd)$_2$ are reacted at temperatures in a range from 450 to 650° C. with $O_2/N_2o$ as the oxidizing agent. However, due to the incomplete combustion of the carbon of the organometallic precursors, the deposited BST layer is only sufficiently pure at 500° C. for acceptable electrical data to be measured.

In the case of BST, it has been found that good conformity of the deposition is achieved when deposition is carried out at lower temperatures, i.e. at temperatures below 500° C., since the deposition proceeds primarily under kinetic control. In contrast, the deposition at above 500° C. is increasingly diffusion controlled. This leads to reduced conformity, as can be seen from the diagrammatic view in FIG. 2.

Thin films of oxide ceramic are increasingly used in the production of semiconductor elements in microelectronics. In order to produce DRAMs (dynamic random access memory chips or DRAM chips) and FRAMs (ferroelectric random access memory chips or FRAM chips), it is possible, for example, to integrate paraelectric BST and ferroelectric SBT (SrBi$_2$Ta$_2$O$_9$) as a dielectric in the storage capacitor. The storage capacitor is constructed according to the stack principle in which a barrier between a lower electrode (Pt electrode) and a plug is necessary. The barrier serves to prevent diffusion in both directions, i.e. the diffusion of oxygen or mobile components of the dielectric (e.g. BiO$_x$ (x=0–2.5)) in the direction of the plug as well as the diffusion of plug material through the platinum to the dielectric. In addition, the barrier can serve as a coupling agent for the platinum layer. A stack capacitor can, for example, be constructed as shown in FIG. 3, i.e. with a lower Pt electrode located on the contact plug, a superposed dielectric layer and an upper Pt electrode disposed above the dielectric layer.

Lower deposition temperatures, for example in the CVD process, than the deposition temperatures previously used (BST: 500–600° C.; SBT: 500–700° C.) offer the following advantages:

a) kinetically controlled deposition leads to better conformity of the ceramic layer, so that higher integratability is ensured; and b) the lower stressing of the oxygen barrier in the stack capacitor makes simpler barrier selection possible.

SUMMARY OF THE INVENTION

It is accordingly an object of the invention to provide a process for producing thin films of oxide ceramic, which overcomes the hereinafore-mentioned disadvantages of the heretofore-known processes of this general type and in which a deposition temperature of the metal oxides is significantly reduced.

With the foregoing and other objects in view there is provided, in accordance with the invention, a process for producing thin films of oxide ceramic by deposition of metal oxides on a surface, which comprises vaporizing organometallic precursors to form gaseous precursors; adding an accelerator to initiate oxidation of the precursors; oxidizing the precursors to form metal oxides; and depositing the metal oxides on a surface.

Other features which are considered as characteristic for the invention are set forth in the appended claims.

Although the invention is illustrated and described herein as embodied in a process for producing thin films of oxide ceramic, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
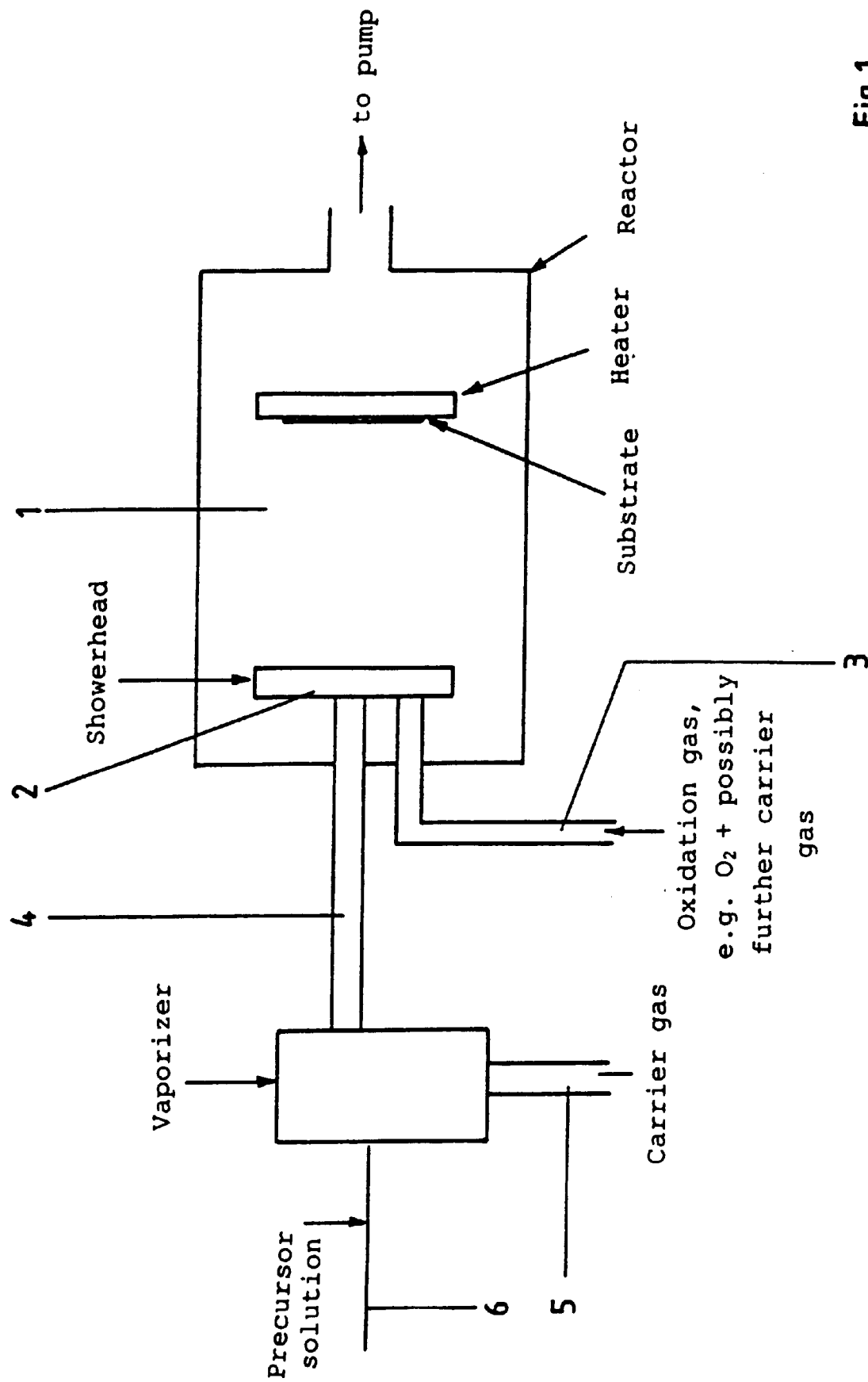
FIG. 1 is a diagrammatic view of a structure of a CVD unit.
Figure 2:
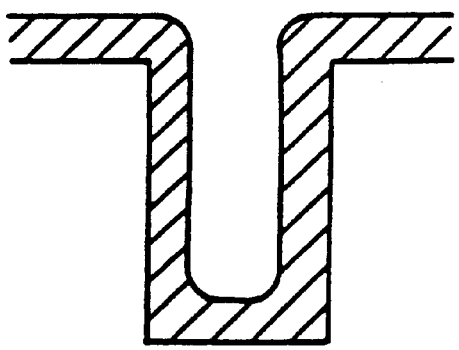
FIG. 2 is fragmentary, sectional view illustrating kinetically controlled and diffusion controlled deposition as discussed above.
Figure 2:
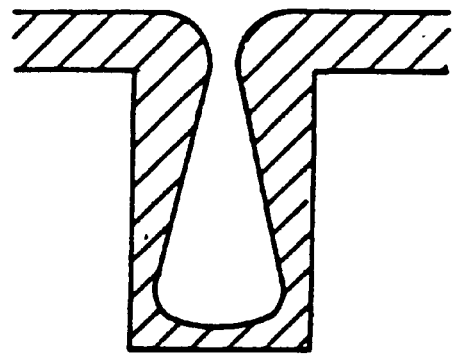
Figure 3:
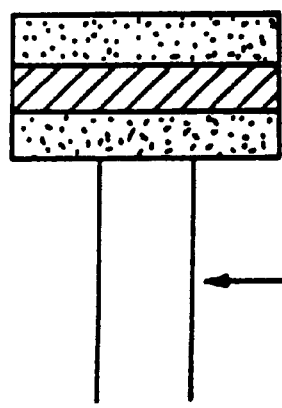
FIG. 3 is a sectional view of a stack capacitor as discussed above.

Referring to the process of the invention as a whole, it is noted that a usually free-radical oxidation process of organometallic precursors is artificially initiated at relatively low temperatures by the addition of an accelerator. It is therefore not necessary to wait until the oxidation process occurs by itself at a higher temperature. Initiation through the use of accelerators leads to free-radical chain reactions through the use of free radicals or formation of accelerator free radicals, with the organometallic precursor being degraded or oxidized. Molecules capable of initiating such chain reactions are therefore those which are either already free radicals or decompose into free radicals upon slight heating.

Furthermore, in the process of the invention there is an increase in the deposition rate at the relatively low temperatures and better combustion of residual carbon.

Accelerators that are used are low molecular weight compounds or molecules. The molecules serve only to initiate the oxidation chain. An oxidation gas or an oxidation gas mixture is available for the oxidation itself. It is also possible to use a plasma, e.g. an oxygen plasma, as an oxidation gas or oxidation mixture.

The free-radical processes which are initiated can proceed either in the gas phase or on the substrate surface. There are indications that a further activation mechanism occurs on the substrate surface. The accelerators that are added can decompose or react at elevated temperature and in the presence of the substrate and thus form reactive species which do not need to have a free-radical nature. The accelerators or their reactive species can in turn activate the organometallic precursors and accelerate their oxidation. Representative examples of such reactive species are carbocations of organic esters or carbenes of diazo compounds.

As already indicated above, the oxidation of the organometallic precursors can be initiated by accelerator free radicals or by formation of accelerator free radicals. Depending on the nature of the accelerator, it is either already in free-radical form under normal conditions (25° C., 1 atm.) or it decomposes into free radicals in the reactor on the way to the hot substrate surface. However, it can also decompose into free radicals in the boundary layer next to the hot substrate surface or on the hot substrate surface itself. Preference is given to using the following accelerator molecules:

1. Molecules which are already free radicals. These include, for example, NO, $NO_2$ and $ClO_2$. It is likewise possible to use mixtures of such free radicals.

For example, when using $NO_2$ as an accelerator, $O_2$ as an oxidizing agent and a hydrocarbon RH (organic part of the organometallic precursor) the following free-radical chain reaction takes place: $RH+NO_2 \rightarrow R.+HNO_2$, $R.+O_2 \rightarrow ROO.$, $ROO.+RH \rightarrow ROOH+R.$, $ROOH \rightarrow RO.+HO.$ (both of these free radicals are new and in turn trigger further chains).

In the case of these molecules, the free-radical chain reaction commences immediately after their introduction into the reactor.

2. Molecules which decompose into free radicals at elevated temperature, for example above 100° C. These molecules decompose into free radicals during the heating of the precursor gas in the reactor on the way to the hot substrate surface. These molecules are present as free radicals immediately after their introduction into the reactor.

Accelerator molecules of this type are all molecules which are suitable as initiators for the free-radical polymerization of plastics and composites. They include carboxylic peroxides such as dibenzoyl peroxide; peracids and their esters; dialkyl peroxides and diaryl peroxides as well as organic azo compounds such as α, α'-azobis-(isobutyronitrile) and azobenzene.

3. Molecules which decompose into free radicals at from 70 to 200° C. Examples of these are nitrate esters of organic alcohols (e.g. $CH_3ONO_2$, $CH_3CH_2ONO_2$) or nitrite esters of organic alcohols (e.g. isoamyl nitrite (($CH_3$)$_3CHCH_2CH_2ONO$). It is also possible to use $H_2O_2$.

4. Molecules which decompose at temperatures above 300° C. For example, it is possible to use nitroalkanes (e.g. $CH_3NO_2$), nitroaromatics, (e.g. $C_6H_5NO_2$), nitrosoalkanes (e.g. $CH_3NO$) and nitrosoaromatics (e.g. $C_6H_5NO$). In this case, the free radicals are generated only just before the heated substrate surface.

5. Free radicals which are generated by physical activation. For example, free radicals which can be used are oxygen free radicals that are generated by UV irradiation of oxygen ($O_2$) or of $N_2O$, NO or $NO_2$.

For example, all of the other molecules mentioned under items 1 to 4 can be stimulated into decomposing into the corresponding free radicals by UV irradiation. Another possible way of effecting the decomposition of the above-mentioned molecules into free radicals is generation of a plasma, e.g. in an electric AC field (e.g. oxygen plasma).

The accelerator molecules are preferably used in a molar ratio of accelerator to precursor in a range from 1:1 to 1:1,000. In the case of the use of reactive species as the accelerator, the molar ratio of accelerator to precursor is in a range from 1:5 to 1:0.1.

It is possible to use all organometallic compounds which are suitable for producing thin films of oxide ceramic by deposition of their metal oxides on a surface, as the organometallic precursors. Examples of organometallic precursors which can be used are: $BiPh_3$, $Bi(thd)_3$, bismuth pivalate, trispentoxylatobismuth, bismuth tris (dimethylamide), $Ta(OEt)_5$, $Ta(thd)$ $(OiPr)$, $Sr(thd)_2$, $Ba(thd)_2$, $Ti(thd)_2(OiPr)_2$, $Ti(OiPr)_4$, $Zr(thd)_4$, $Pb(thd)_2$ and/or mixtures thereof.

The organometallic precursors can be vaporized in conventional vaporization systems.

In the oxidation of the precursors, use is made of an oxidizing agent which is generally a gas or a gas mixture. Preference is given to using oxygen gas ($O_2$).

The substrate employed can be any suitable substrate material. These include experimental electrodes, electrode materials for integration of a dielectric, noble metal electrodes, oxide electrodes and non-conductive substrates.

The metal oxides are preferably deposited by the CVD process. In the CVD process, chemical compounds, e.g. organometallic compounds, which can be readily vaporized or are already gases are reacted on a hot substrate surface to produce a film having particular properties, e.g. a metal oxide film.

The accelerator molecules can be introduced into the CVD reactor in a manner depending on their consistency and stability.

If the accelerators are formed of readily vaporizable molecules or gaseous molecules or free radicals, they can be simply mixed into the gas mixture. This can be carried out at various places, as is shown by way of example in FIG. 1.

FIG. 1 shows that a precursor gas is produced from a precursor solution which is converted into a gas in a vaporizer. The vaporizer can be a flash vaporizer, for example. A carrier gas, e.g. Ar or $N_2$, which is introduced at a position 5, conveys the vapor to a showerhead. There it is mixed with oxidation gas and possible further carrier gases. The use of a showerhead is necessary to ensure uniform laminar gas flow in a reactor. After leaving the showerhead, the gas mixture of the precursor gas, the oxidation gas and the carrier gas flows to a hot substrate on a heater where the corresponding metal oxides are deposited. The reactor leads to a pump.

A gaseous or readily vaporizable accelerator can be added to the gas mixture at various places: it can be added to the oxidation gas/carrier gas mixture at a position 3 or else to the precursor gas/carrier gas mixture at a position 4 or else it can be introduced separately into the showerhead at a position 2 together with a little carrier gas. If the accelerator is very reactive, it can also be introduced completely separately into a reactor chamber at a position 1, e.g. through a ring with holes which are directed towards the substrate.

Finally, the accelerators can also be introduced through a precursor inlet system, e.g. at a position 6 in FIG. 1. This is possible, for example, by using a flash vaporization system which is coupled to a liquid delivery system (LDS). If an LDS is used, a small amount of the molecules is simply mixed beforehand into the precursor solution and then vaporized with the precursors. In this case, it is important that the molecules being used are still stable at the temperature of the precursor inlet system and do not react with the precursors or the solvent.

Depending on the CVD process, the deposition temperature can be reduced by from 50 to 200° C.

The following examples illustrate the process of the invention:

EXAMPLE 1

In order to produce a thin film of SBT by the CVD process, the organometallic precursors ($Sr(thd)_2$(tetraglyme)

(bis(2,2,6,6,-tetramethylheptane-3,5-dionato(tetraglyme) strontium), Ta(thd) (OiPr)$_4$ (2,2,6,6,-tetramethylheptane-3, 5-dionatotantalum tetraisopropoxide) and BiPh$_3$ (triphenylbismuth) are used in a solvent mixture of THF/ iPrOH/tetraglyme (8:2:1). This solution is introduced at a rate of 0.15 ml/min into the flash vaporizer which is at a temperature of 200° C. 200 cm$^3$ of argon serve as carrier gas. The resulting gas mixture is introduced into the showerhead. 600 cm$^3$ of argon and 400 cm$^3$ of O$_2$ are introduced at a different connection to the showerhead. 10 cm$^3$ of NO$_2$ are mixed into this gas. The gases are mixed in the showerhead and then discharged into the reactor chamber. There they impinge on a 6' Si wafer coated with Pt/Ti/SiO$_2$. The platinum has a layer thickness of 200 nm, the titanium has a layer thickness of 30 nm and the SiO$_2$ is 625 nm thick. The temperature of the wafer is 500° C. (or higher) and the total pressure in the reactor chamber is 3 torr. The proportion of oxygen is from 25 to 80%.

Mirror-like SBT coatings having good edge covering are obtained.

EXAMPLE 2

For the deposition of BST, the precursors Sr(thd)$_2$ (tetraglyme) (bis(2,2,6,6,-tetramethylheptane-3,5-dionato) (tetraglyme) strontium), Ba(thd)$_2$ (tetraglyme) (bis(2,2,6,6,-tetramethylheptane-3,5-dionato)(tetraglyme)barium) and Ti (thd)$_2$(OiPr)$_2$ (bis(2,2,6,6,-tetramethylheptane-3,5-dionato) titanium diisopropoxide) are used in a solvent mixture of THF/iPrOH/tetraglyme (8:2:1). This solution is introduced at a rate of 0.15 ml/min into the flash vaporizer which is at a temperature of 240° C. 200 cm$^3$ of argon serve as the carrier gas. The resulting gas mixture is introduced into the showerhead. 200 cm$^3$ of argon, 500 cm$^3$ of O$_2$ and 500 cm$^3$ of N$_2$O are introduced at another connection to the showerhead. 10 cm$^3$ of NO$_2$ are mixed into this gas as the accelerator. The gases are mixed in the showerhead and then discharged into the reactor chamber. There they impinge on a 6' Si wafer coated with Pt/Ti/SiO$_2$. The platinum has a layer thickness of 200 nm, the titanium has a layer thickness of 30 nm and the SiO$_2$ is 625 nm thick. The temperature of the wafer is 400° C. and the total pressure in the reactor chamber is 1 torr.

Mirror-like BST coatings having good edge covering are obtained at a good deposition rate.

EXAMPLE 3

In place of 10 ml of NO$_2$ as in Example 1 or 2, 10 ml of NO are used as the accelerator. Mirror-like SBT or BST coatings having good edge covering are again obtained at a good deposition rate.

EXAMPLE 4

In place of 10 ml of NO$_2$ as in Example 1 or 2, 0.02 mmol/min of nitromethane in 50 cm$^3$ of carrier gas are introduced together with the oxidation gas/carrier gas. The nitromethane, which has a boiling point of 101° C. (760 torr), is vaporized in a bubbler by passing the carrier gas through it. The bubbler can be heated to counter cooling caused by vaporization and to adjust the vaporization rate. As an alternative, it is also possible to use nitroethane (vaporization temperature 115° C./760 torr). Both nitro compounds decompose above about 250° C. and initiate free-radical chains.

In this case too, SBT and BST coatings having excellent edge covering are obtained at a good deposition rate.

EXAMPLE 5

A solution of peroxyacetic acid in THF is vaporized at about 60° C. in a flash vaporizer. 100 cm$^3$ of argon serve as the carrier gas. The vaporizer feeds its gas into the oxidation gas/carrier gas line. The pressure in the vaporizer is therefore the same as in the showerhead and thus almost the same as in the reaction chamber. Otherwise, the procedure is as in Examples 1 and 2. About 0.02 mmol/min of peroxyacetic acid are vaporized. In place of peroxyacetic acid, it is also possible to use its methyl or ethyl ester.

EXAMPLE 6

The procedure is the same as in Example 5, except that dibenzoyl peroxide in THF is vaporized at a temperature of about 60° C.

EXAMPLE 7

The procedure is the same as in Example 5, except that nitrobenzene in THF is vaporized at a temperature of 150° C. Nitrosobenzene can also be used in place of nitrobenzene.

EXAMPLE 8

The procedures of Example 1 or Example 2 are repeated, except that nitrobenzene is used as the accelerator. The nitrobenzene is added to the precursor solution and vaporized together with the precursors in precursor vaporizers. As an alternative, it is also possible to use nitrosobenzene.

EXAMPLE 9

The procedures of Example 1 or Example 2 are repeated, except that H$_2$O$_2$ is used as the accelerator. For this purpose, a 30% H$_2$O$_2$ solution in water is vaporized in a flash vaporizer. A supply rate of 0.02 mmol/min is again maintained. The water/ H$_2$O$_2$ gas mixture is introduced through a separate ring which is located in front of the hot substrate surface.

The SBT or BST coatings obtained from Examples 5 to 9 again display good edge covering at a good deposition rate.

I claim:

1. A process for producing thin films of oxide ceramic by deposition of metal oxides on a surface, which comprises the following steps:

vaporizing organometallic precursors to form gaseous precursors;

adding free radicals generated from compounds selected from the group consisting of carbenes of diazo compounds, nitroalkanes, nitroaromatics, nitrosoalkanes and nitrosoaromatics, as an accelerator to initiate oxidation of the precursors;

oxidizing the precursors to form metal oxides; and depositing the metal oxides on the surface.

2. The process according to claim 1, wherein the molar ratio of the accelerator to the precursors is in a range from 1:5 to 1:0.1.

3. The process according to claim 1, which comprises selecting the organometallic precursors from the group consisting of BiPh$_3$, Bi(thd)$_3$, bismuth pivalate, trispentoxylatobismuth, bismuth tris(dimethylamide), Ta(OEt)$_5$, Ta(thd) (OiPr)$_4$, Sr(thd)$_2$, Ba(thd)$_2$, Ti(thd)$_2$(OiPr)$_2$, Ti(OiPr)$_4$, Zr(thd)$_4$, Pb(thd)$_2$ and mixtures thereof.

* * * * *